(12) United States Patent
Nagano

(10) Patent No.: US 8,558,335 B2
(45) Date of Patent: Oct. 15, 2013

(54) SOLID-STATE IMAGING DEVICE AND MANUFACTURING METHOD THEREOF, AND ELECTRONIC APPARATUS

(75) Inventor: Mitsuhiro Nagano, Kumamoto (JP)

(73) Assignee: Sony Corporation, Tokyo (JP)

( * ) Notice: Subject to any disclaimer, the term of this patent is extended or adjusted under 35 U.S.C. 154(b) by 141 days.

(21) Appl. No.: 13/286,701

(22) Filed: Nov. 1, 2011

(65) Prior Publication Data

US 2012/0112254 A1 May 10, 2012

(30) Foreign Application Priority Data

Nov. 8, 2010 (JP) ................................. 2010-249477

(51) Int. Cl.

| H01L 27/14 | (2006.01) |
|---|---|
| H01L 21/02 | (2006.01) |
| H01L 27/146 | (2006.01) |
| H01L 31/102 | (2006.01) |
| H01L 31/101 | (2006.01) |
| H01L 31/00 | (2006.01) |
| H01L 21/00 | (2006.01) |

(52) U.S. Cl.
USPC ........... 257/431; 257/414; 257/437; 257/445; 257/458; 257/462; 257/464; 257/E33.076; 257/E31.082; 257/E31.121; 257/E27.163; 257/E21.029; 438/48; 438/69; 438/72; 438/75

(58) Field of Classification Search
None
See application file for complete search history.

(56) References Cited

U.S. PATENT DOCUMENTS

| 7,572,571 B2 * | 8/2009 | Moon ........................... 430/290 |
| 2010/0127260 A1 * | 5/2010 | Matsuyama .................... 257/49 |
| 2010/0201834 A1 * | 8/2010 | Maruyama et al. ........ 348/222.1 |

FOREIGN PATENT DOCUMENTS

JP        2000-196051        7/2000

* cited by examiner

*Primary Examiner* — Julio J Maldonado
*Assistant Examiner* — Harpreet Singh
(74) *Attorney, Agent, or Firm* — Dentons US LLP

(57) ABSTRACT

A solid-state imaging device includes a photoelectric conversion unit that is formed on a semiconductor substrate, a reading unit that reads signal charges of the photoelectric conversion unit, a gate insulating film and an electrode disposed thereon that constitute the reading unit, a light shielding film that covers the electrode, and an antireflection film that is formed on the photoelectric conversion unit and is constituted by films of four or more layers. The film of the lower layer of the antireflection film is also used as a stopper film during patterning, and a gap between the end of the light shielding film and the semiconductor substrate which is defined by interposing a plurality of films of the lower layer of the antireflection film is set so as to be smaller than the thickness of the gate insulating film.

11 Claims, 8 Drawing Sheets

SOLID-STATE IMAGING DEVICE AND MANUFACTURING METHOD THEREOF, AND ELECTRONIC APPARATUS

BACKGROUND

The present disclosure relates to a solid-state imaging device and a manufacturing method thereof, and an electronic apparatus such as a camera including the solid-state imaging device.

As a solid-state imaging device (an imaging sensor), a CCD solid-state imaging device or a CMOS solid-state imaging device and the like are suggested. These solid-state imaging devices are used in a digital still camera, a digital video camera, and various portable terminal devices such as a mobile phone with camera, or the like.

The CCD solid-state imaging device includes photodiodes (photoelectric conversion units) which are two-dimensionally arranged and constitute a plurality of light sensing portions, vertical transfer registers of a CCD structure which are arranged in each light sensing portion column, and horizontal transfer registers of a CCD structure which are disposed at ends of the vertical transfer registers. In addition, output portions are connected to the ends of the horizontal transfer registers.

The CMOS solid-state imaging device forms a unit pixel by photodiodes (photoelectric conversion units) constituting the light sensing portions and a plurality of pixel transistors, and is constituted by two-dimensionally arranging a plurality of pixels. In general, a plurality of pixel transistors is constituted by four transistors of a transfer transistor, an amplification transistor, a reset transistor, and a selection transistor, or three transistors in which the selection transistor is omitted. Alternatively, these pixel transistors can be also used as a plurality of photodiodes. In order to apply a desired pulse voltage to a plurality of the pixel transistors and read a signal current, each terminal of the pixel transistors is connected by a multilayer wiring.

In the solid-state imaging device, an antireflection film for decreasing a light reflectivity is formed on a light sensing surface of the photodiode performing a photoelectric conversion. In the antireflection film, it is necessary to optimize a film thickness, a film kind, a film configuration, or the like in order to decrease the reflection of the light sensing surface.

In Japanese Unexamined Patent Application Publication No. 2000-196051, an example of the antireflection film according to the related art is disclosed. The antireflection film disclosed in Japanese Unexamined Patent Application Publication No. 2000-196051 is applied to the CCD solid-state imaging device, and is provided with a multilayer film structure in which a first high refractive index film, a first low refractive index film, a second high refractive index film, and a second low refractive index film are laminated on a light sensing portion via a gate insulating film. The second low refractive index film is formed by a laminated film of a low refractive index film and an interlayer insulating film. The first high refractive index film is formed of a silicon nitride film, the first low refractive index film is formed of a silicon oxide film, and the second high refractive index film is formed of a silicon nitride film. In addition, a portion of the second low refractive index film is formed of a silicon oxide film. A light shielding film of metal covering a transfer electrode excluding the light sensing surface is formed on the interlayer insulating film which is a portion of the second low refractive index film.

SUMMARY

The above-described light shielding film is installed in order to secure smear characteristics. In the CCD solid-state imaging device, light passes through an opening of the light shielding film and is incident to the light sensing surface. However, a portion of the incident light is multiply reflected in a gap between the end of the light shielding film and a semiconductor substrate and is incident into the semiconductor substrate, and smear occurs. In order to decrease the smear component, the gap (distance) between the end of the light shielding film and the semiconductor substrate is designed to be small as possible. However, for example, in Japanese Unexamined Patent Application Publication No. 2000-196051, in order to decrease the gap between the end of the light shielding film and the semiconductor substrate, it is extremely difficult to locally control the thickness of the insulating film between the end of the light shielding film and the semiconductor substrate by a selection etching. That is, since both the interlayer insulating film and the gate insulating film formed between the end of the light shielding film and the semiconductor substrate are formed of a silicon oxide film, it is difficult to control the film thickness by the selection etching. Therefore, it is difficult to secure uniformity of the film thickness in the semiconductor wafer, and smear characteristics are greatly varied due to the fact that the film thickness varies between lots. In addition, when the gap between the end of the light shielding film and the semiconductor substrate is too small and a portion of the end of the light shielding film contacts the surface of the semiconductor substrate, this becomes a cause of noise generation such as white spot deterioration. Thereby, the yield and the smear characteristics become unstable.

In order to stably shield the light, it is necessary to form the light shielding film with high accuracy. However, according to miniaturization of pixels, processes for forming the light sensing surface and the light shielding film are complicated and difficult.

On the other hand, the total thickness of the antireflection film described in Japanese Unexamined Patent Application Publication No. 2000-196051 is 300 nm or more. Therefore, the filtering effect is great and the light transparency is small with respect to the wavelength of light.

Thus, it is desirable to provide a solid-state imaging device and manufacturing method thereof capable of improving stabilization of smear characteristics and achieving both an antireflection effect and a light transparency improvement.

In addition, it is desirable to provide an electronic apparatus such as a camera including the solid-state imaging device.

According to an embodiment of the present disclosure, there is provided a solid-state imaging device including a photoelectric conversion unit that is formed on a semiconductor substrate, a reading unit that reads signal charges of the photoelectric conversion unit, and a gate insulating film and an electrode disposed thereon that constitute the reading unit. In addition, the solid-state imaging device includes a light shielding film that covers the electrode, and an antireflection film that is formed on the photoelectric conversion unit and is constituted by films of four or more layers. A film of a lower layer of the antireflection film is also used as a stopper film during patterning, and a gap between the end of the light shielding film and the semiconductor substrate which is defined by interposing a plurality of films of the lower layer of the antireflection film is set so as to be smaller than the thickness of the gate insulating film.

In the solid-state imaging device of the embodiment of the present disclosure, since there is provided the antireflection film constituted by four or more layers of thin films on the photoelectric conversion unit, the antireflection effect of the antireflection film can be obtained, and the light transmittance is improved. In addition, since there is provided the film of the lower layer which is also used as the stopper film during patterning, the gap between the end of the light shielding film and the semiconductor substrate can be stably set with high accuracy. The gap is defined by the film of the thickness which is smaller than that of the gate insulating film, and therefore, smears and white spots can be suppressed.

According to another embodiment of the present disclosure, there is provided a manufacturing method of a solid-state imaging device including the following processes. That is, the method includes: forming a photoelectric conversion unit and a reading unit that reads signal charges of the photoelectric conversion unit on a semiconductor substrate; and forming a gate insulating film and an electrode disposed thereon that selectively constitutes the reading unit while excluding the photoelectric conversion unit. Subsequently, the method includes: forming films of four or more layers which cover the photoelectric conversion unit and the electrode and constitute an antireflection film; and providing a film of a lower layer of the films of four or more layers as a stopper film, and selectively removing upper films than the stopper film among the films of four or more layers which are disposed on the electrode including the periphery of the photoelectric conversion unit. Thereafter, the method includes forming a light shielding film covering the electrode via a plurality of films of the lower layer including the stopper film so that the end of a light shield film is positioned on the periphery of the photoelectric conversion unit and the gap between the end of the light shielding film and the semiconductor substrate is defined so as to be set smaller than the thickness of the gate insulating film. Thereby, the antireflection film constituted by the films of four or more layers is formed on the photoelectric conversion unit.

According to the manufacturing method of the solid-state imaging device of the embodiment of the present disclosure, by providing the film of the lower layer of the films of four or more layers constituting the antireflection film as the stopper film and patterning the films which are disposed on the film of the lower layer, the gap between the end of the light shielding film and the semiconductor substrate can be stably set with high accuracy. The gap is defined so as to be set smaller than the thickness of the gate insulating film, and therefore, smears and white spots are suppressed. Since the antireflection film is formed of the thin films of four or more layers on the main region of the photoelectric conversion unit, the antireflective effect of the antireflection film is obtained, and the light transmittance is improved.

According to still another embodiment of the present disclosure, there is provided an electronic apparatus including: the solid-state imaging device; an optical system that introduces incident light into the photoelectric conversion unit of the solid-state imaging device; and a signal processing circuit that processes the output signal of the solid-state imaging device. The solid-state imaging device includes: a photoelectric conversion unit that is formed on a semiconductor substrate; a reading unit that reads the signal charges of the photoelectric conversion unit; and a gate insulating film and an electrode disposed thereon that constitute the reading unit. In addition, the solid-state imaging device includes a light shielding film that covers the electrode; and an antireflection film that is constituted by films of four or more layers formed on the photoelectric conversion unit. Moreover, since a film of a lower layer of the antireflective film is also used as a stopper film during patterning, the gap between the end of the light shielding film and the semiconductor substrate which is defined by interposing a plurality of films of the lower layer of the antireflection film is set so as to be smaller than the thickness of the gate insulating film.

According to the solid-state imaging device and the manufacturing method thereof of embodiments of the present disclosure, the solid-state imaging device capable of improving stabilization of smear characteristics and achieving both an antireflection effect and a light transparency improvement can be provided.

According to the electronic apparatus of the embodiment of the present disclosure, the electronic apparatus having a high quality image capable of improving stabilization of smear characteristics and achieving both an antireflection effect and a light transparency improvement in the solid-state imaging device can be provided.

DETAILED DESCRIPTION OF EMBODIMENTS

Hereinafter, configurations for embodying the present disclosure (hereinafter, referred to as embodiments) will be described. In addition, the description will be performed according to the following order.

1. First Embodiment (Configuration Example of Solid-State Imaging Device and Example of Manufacturing Method Thereof)
2. Second Embodiment (Configuration Example of Solid-State Imaging Device and Example of Manufacturing Method Thereof)
3. Third Embodiment (Configuration Example of Solid-State Imaging Device and Example of Manufacturing Method Thereof)
4. Fourth Embodiment (Configuration Example of Electronic Apparatus)

1. First Embodiment

Configuration Example of Solid-State Imaging Device

Figure 1:
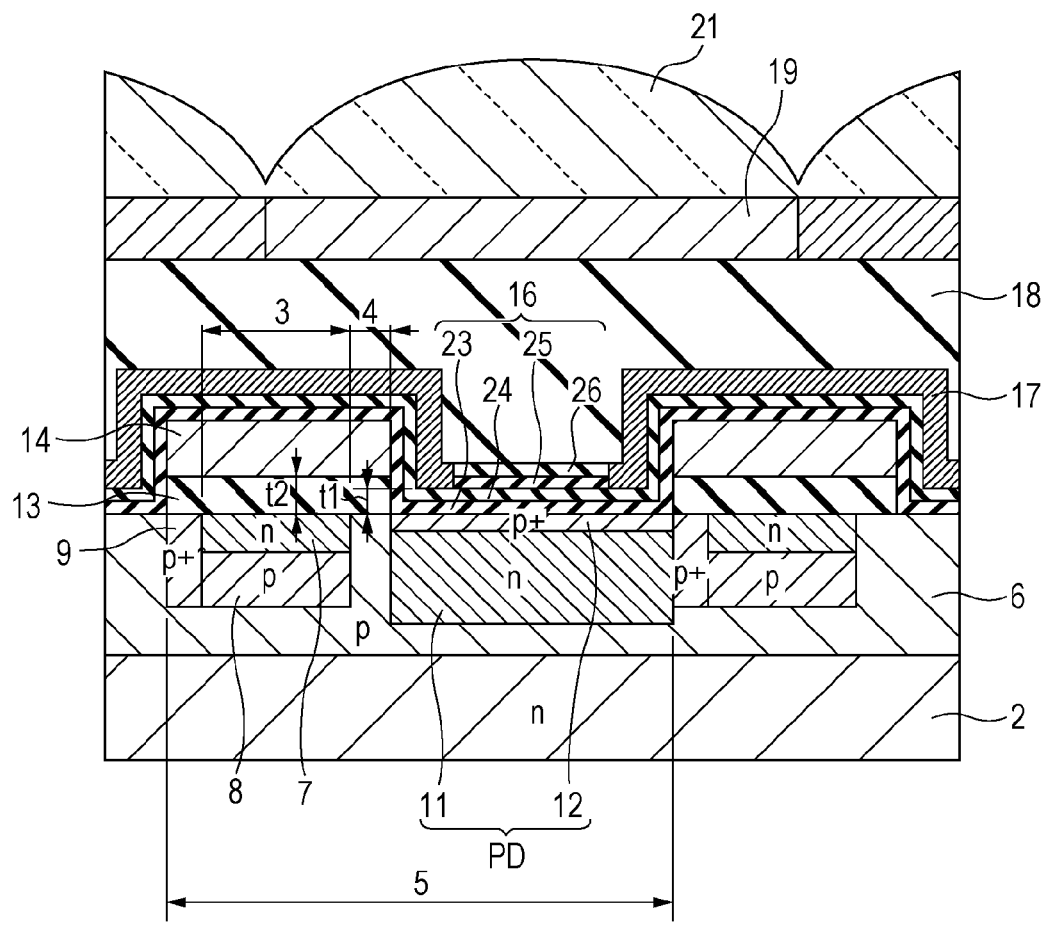
FIG. 1 is a schematic configuration diagram illustrating a first embodiment of a solid-state imaging device according to the present disclosure.

FIG. 1 illustrates a first embodiment of a solid-state imaging device according to the present disclosure. The present embodiment is a case which is applied to a CCD solid-state imaging device. FIG. 1 illustrates a schematic cross-sectional configuration of a main portion including a photoelectric conversion unit (photodiode) constituting a light sensing portion and a vertical transfer register. In the solid-state imaging device 1 of the first embodiment, for example, photodiodes PD constituting a plurality of light sensing portions are two-dimensionally arranged on a silicon semiconductor substrate 2, and the vertical transfer register 3 having a CCD structure for reading signal charges of the photodiode PD corresponding to each column of the light sensing portions are formed.

A pixel 5 includes the photodiode PD and, a reading unit for reading the signal charges of the photodiode PD, that is, a transfer portion which includes a charge reading unit 4 and corresponds to the photodiode PD of the vertical transfer register 3. The photodiode PD is formed so as to include: a first conductivity-type, for example, a p-type first semiconductor well region 6 which is formed on the semiconductor substrate 2; a second conductivity-type, for example, an n-type semiconductor region 11; and a p-type semiconductor region 12 which also serves for dark current suppression of the surface side of the n-type semiconductor region 11. In the p-type first semiconductor well region 6, an n-type embedded channel region 7, a p-type second semiconductor well region 8 which is disposed just below the n-type embedded channel region 7, and a p-type channel stop region 9 separating the pixels 5 are formed corresponding to each column of the light sensing portions. The charge reading unit 4 is formed between the photodiode PD and the vertical transfer register 3.

A gate insulating film 13 is formed on the region including the embedded channel region 7, and a transfer electrode 14 is formed on the gate insulating film 13. The transfer electrode 14 is arranged along a transfer direction having a width which is extended over the embedded channel region 7, the charge reading unit 4, and the channel stop region 9. The vertical transfer register 3 is formed by the embedded channel region 7, the gate insulating film 13, and the transfer electrode 14.

In addition, a planarized film 18 constituted by an insulating film, a color filter 19, and an on-chip lens 21 are sequentially formed via an antireflection film 16 and a light shielding film 17 which are characteristics of the present embodiment described hereinafter on the upper portion of the semiconductor substrate 2.

In addition, in the present embodiment, the antireflection film 16 constituted by films of four layers is formed on the photodiode PD, the light shielding film 17 is formed so as to cover the transfer electrode 14 and reach the peripheral end of the photodiode excluding the main region of the photodiode PD. In the antireflection film 16 constituted by the films of four layers, a first silicon oxide film 23, a first silicon nitride film 24, a second silicon oxide film 25, and a second silicon nitride film 26 are laminated in order from a light sensing surface of the photodiode PD. The gate insulating film 13 is formed only just below the transfer electrode 14, and is not formed on the surface of the photodiode PD.

The first silicon oxide film 23 and the first silicon nitride film 24 are formed over the entire surface of the photodiode PD and the transfer electrode 14. The total thickness t1 of the first silicon oxide film 23 and the first silicon nitride film 24 is set so as to be smaller than the thickness t2 of the gate insulating film 13 under the transfer electrode 14. As is apparent in the manufacturing method described below, the first silicon nitride film 24 of the lower layer of the antireflection film 16 also serves as a stopper film when patterning the second silicon oxide film 25 of the upper layer, that is, as an etching stopper film.

The films of the upper layer such as the second silicon oxide film 25 and the second silicon nitride 26 are formed on the main region excluding the peripheral end of the photodiode. Accordingly, the antireflection film 16 constituted by the film of four layers is formed only on the main region of the photodiode PD.

On the other hand, for example, the light shielding film 17 is formed of a metal film such as tungsten (W). The light shielding film 17 is formed on the region which covers the transfer electrode 14 on the film of two layers of the first silicon oxide film 23 and the first nitride film 24 and reaches the peripheral end of the photodiode. The end portion of the light shielding film 17 contacts the first silicon nitride film 24 corresponding to the peripheral end of the photodiode.

It is preferable that the thickness of the first silicon oxide film 23 is 10 nm or less and the thickness of the first silicon nitride film 24 is 30 nm or less, and the total thickness of the two layers is set to less than the thickness of the gate insulating film 13. Considering the antireflection effect of the antireflection film constituted by the films of four layers, the thickness of the second silicon oxide film 25 is about 5 nm to 35 nm and the thickness of the second silicon nitride film 26 is about 15 nm to 45 nm. For example, the thickness of the gate insulating film 13 is about 40 nm. Each thickness of the antireflection film 16 is optimized so as to obtain the antireflection effect at the wavelength region of desired light.

According to the solid-state imaging device 1 according to the first embodiment, since the antireflection film 16 constituted by the film of four layers is formed on the photodiode PD, the wavelength region of the necessary light, that is, the reflective light at the visual light region can be reduced. Since the total thickness of the antireflection film 16 is small, the light transparency is excellent. Accordingly, both the antireflection effect and the light transparency can be improved. In addition, the gap (distance) between the end of the light shielding film 17 and the surface of the semiconductor substrate is defined as the total thickness t1 of the first silicon oxide film 23 and the first silicon nitride 24 which are the films constituting the antireflection film 16, and the total film thickness t1 is smaller than the thickness of the gate insulating film 13. Thereby, the light passing through between the end of the light shielding film and the semiconductor substrate is suppressed, and smear occurrence or white spot occurrence and the like due to the light which passes through can be decreased.

Since the first silicon nitride film 24 of the lower layer of the antireflection film 16 becomes the etching stopper when patterning the second silicon oxide film 25 of the upper layer, the thickness of the insulating film between the end of the light shielding film and the semiconductor substrate can be stably set with high accuracy. Accordingly, even though a unit pixel size is miniaturized, variations of characteristic values such as smears or white spots, or defects can be suppressed, and a stable solid-state imaging device can be provided.

Example of Manufacturing Method of Solid-State Imaging Device

Figure 2A:
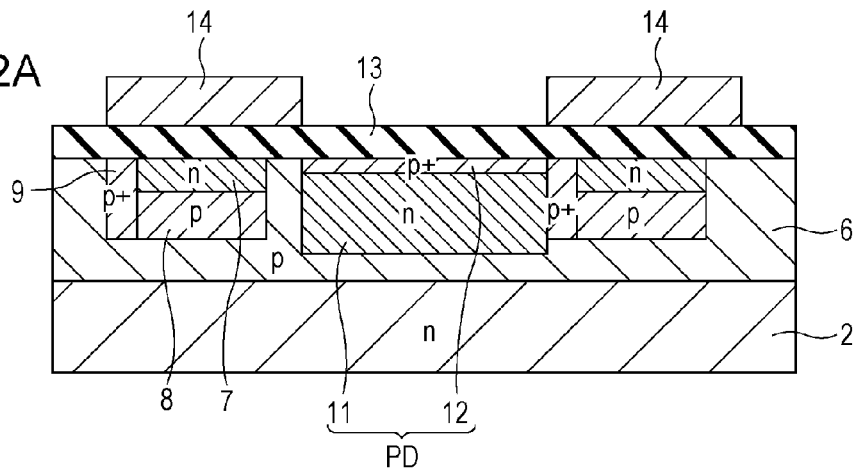
FIGS. 2A to 2C are manufacturing process diagrams (the first) illustrating a manufacturing method of the solid-state imaging device according to the first embodiment.

FIGS. 2A to 4B illustrate the manufacturing method of the solid-state imaging device 1 according to the first embodiment. First, as illustrated in FIG. 2A, the first semiconductor well region 6 is formed on the semiconductor substrate 2, and the photodiode PD, the embedded channel region 7, the second semiconductor well region 8, the channel stop region 9, or the like are formed on the first semiconductor well region 6. The photodiode PD is formed so as to include the n-type semiconductor region 11 of the second conductivity-type and the p-type semiconductor region 12 of the first conductivity-type which is disposed at the surface side of the n-type semiconductor region 11. Subsequently, the gate insulating film 13 is formed on the entire surface of the semiconductor substrate 2, and the transfer electrode 14 constituting the vertical transfer register is formed on the gate insulating film 13. For example, the transfer electrode 14 can be formed of a polysilicon film.

Figure 2B:
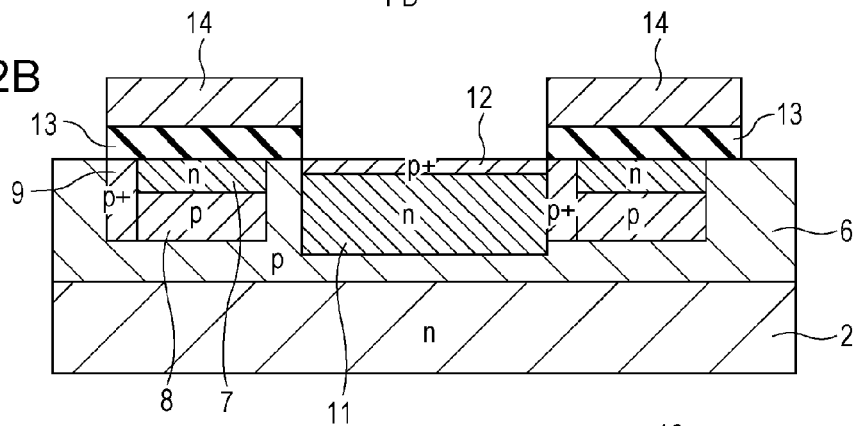

Next, as illustrated in FIG. 2B, the gate insulating film 13 excluding the region which is just below the transfer electrode 14 is removed by etching with the transfer electrode 14 as the mask.

Figure 2C:
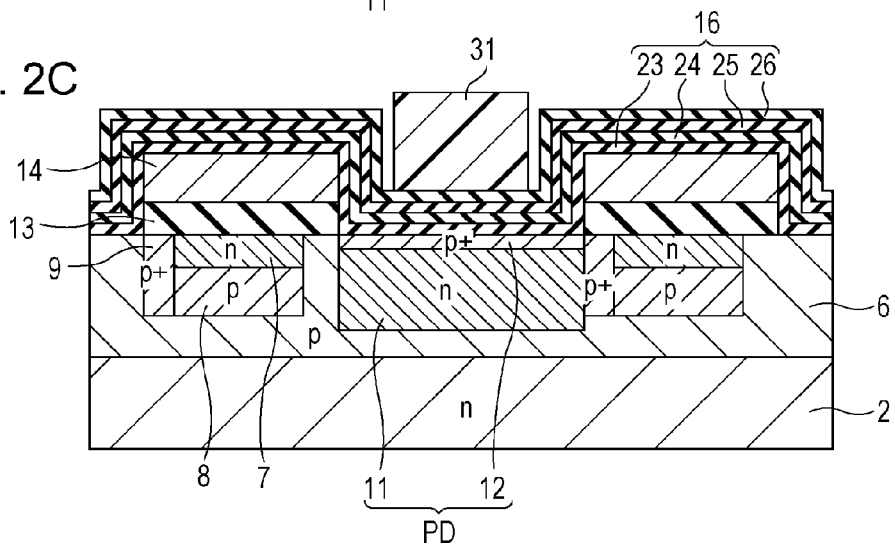

Next, as illustrated in FIG. 2C, the antireflection film 16 constituted by the films of four layers is formed over the entire surface of the semiconductor substrate 2 including the photodiode PD and the transfer electrode 14. That is, the first silicon oxide film 23, the first silicon nitride film 24, the second silicon oxide film 25, and the second silicon nitride film 26 are formed in order from the semiconductor substrate surface toward the upper portion, and form the antireflection film 16. Next, a resist mask 31 is formed at the position which is corresponding to the main portion of the photodiode PD on the antireflection film 16.

Figure 3A:
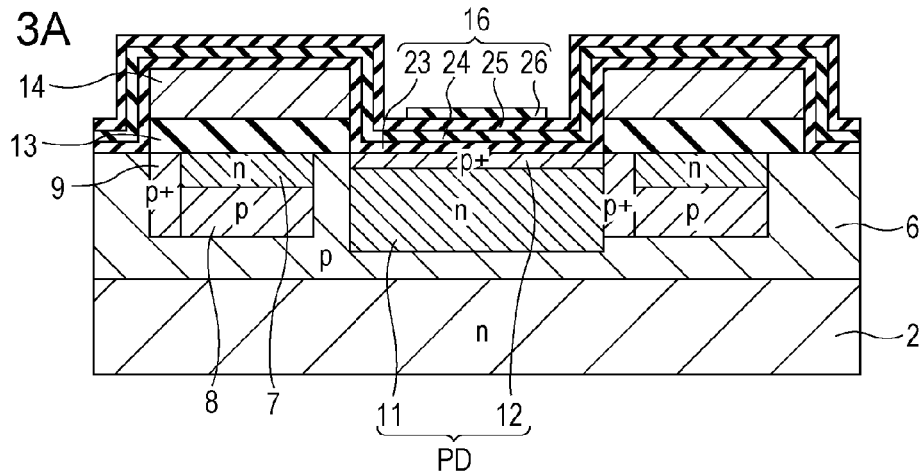
FIGS. 3A to 3C are manufacturing process diagrams (the second) illustrating the manufacturing method of the solid-state imaging device according to the first embodiment.

Next, as illustrated in FIG. 3A, the second silicon nitride film 26 is selectively removed by etching via the resist mask 31. The second silicon nitride film 26 remains only on the main region of the photodiode PD.

Figure 3B:
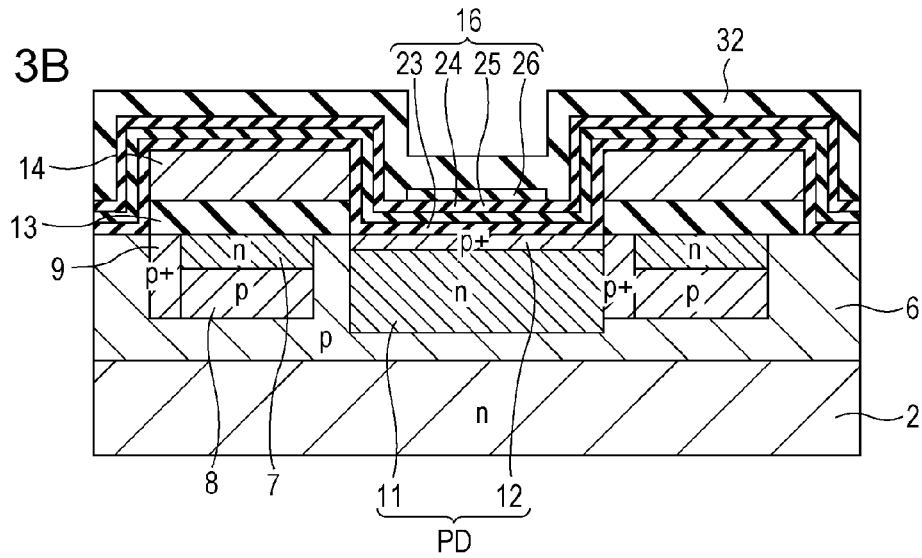

Next, as illustrated in FIG. 3B, a protective film 32 is formed on the entire surface by silicon oxide film. The protective film 32 is the film which is necessary to protect the other portion in the subsequent process.

Figure 3C:
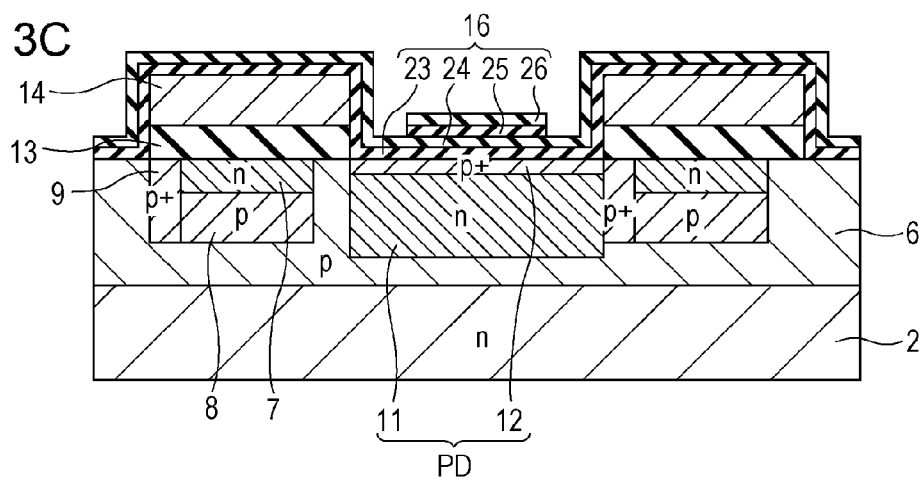

Next, as illustrated in FIG. 3C, the protective film 32 of the silicon oxide film and the second silicon oxide film 25 are removed by etching. In the above etching process, the second silicon oxide film 25 is selectively removed by etching with the second silicon oxide film 26, which remains in the main region of the photodiode PD, as the mask. Simultaneously, the first silicon nitride film 24 which is the second layer of the lower layer becomes an etching stopper film, and the etching ends at the surface of the first silicon nitride film 24. In the above process, the second silicon oxide film 25 and the second silicon nitride film 26 remain only on the main region of the photodiode PD. In addition, the films of two layers of the first silicon oxide film 23 and the first silicon nitride film 24 remain from the peripheral end of the photodiode PD to the transfer electrode 14. A desired film thickness on the peripheral end of the photodiode PD, that is, the insulating film (the films of two layers 23 and 24) having smaller film thickness t1 than the thickness t2 of the gate insulating film 13 is stably formed with high accuracy.

Figure 4A:
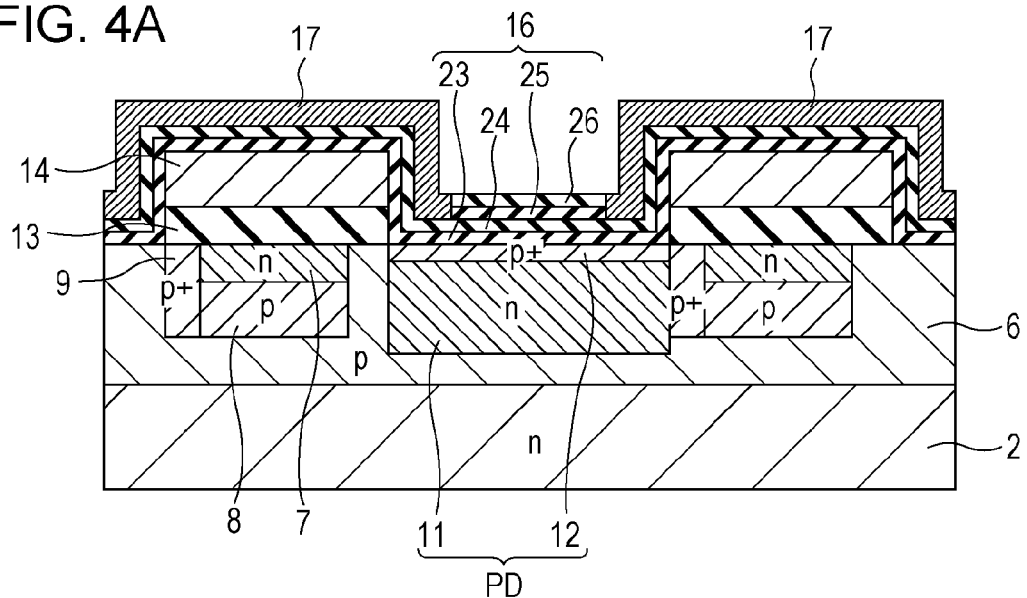
FIGS. 4A and 4B are manufacturing process diagrams (the third) illustrating the manufacturing method of the solid-state imaging device according to the first embodiment.

Next, after the light shielding film 17 of metal is formed on the entire surface, the light shielding film 17 is patterned and remains so as to cover only the transfer electrode 14 excluding the main region of the photodiode PD. Thereby, as illustrated in FIG. 4A, the antireflection film 16, in which the films of four layers 23 to 26 are laminated on the main region of the photodiode PD, is formed. In addition, the gap between the end of the light shielding film 17 and the semiconductor substrate 2 is defined as the film thickness t1 of two layers of the first silicon oxide film 23 and the first silicon nitride film 24.

Figure 4B:
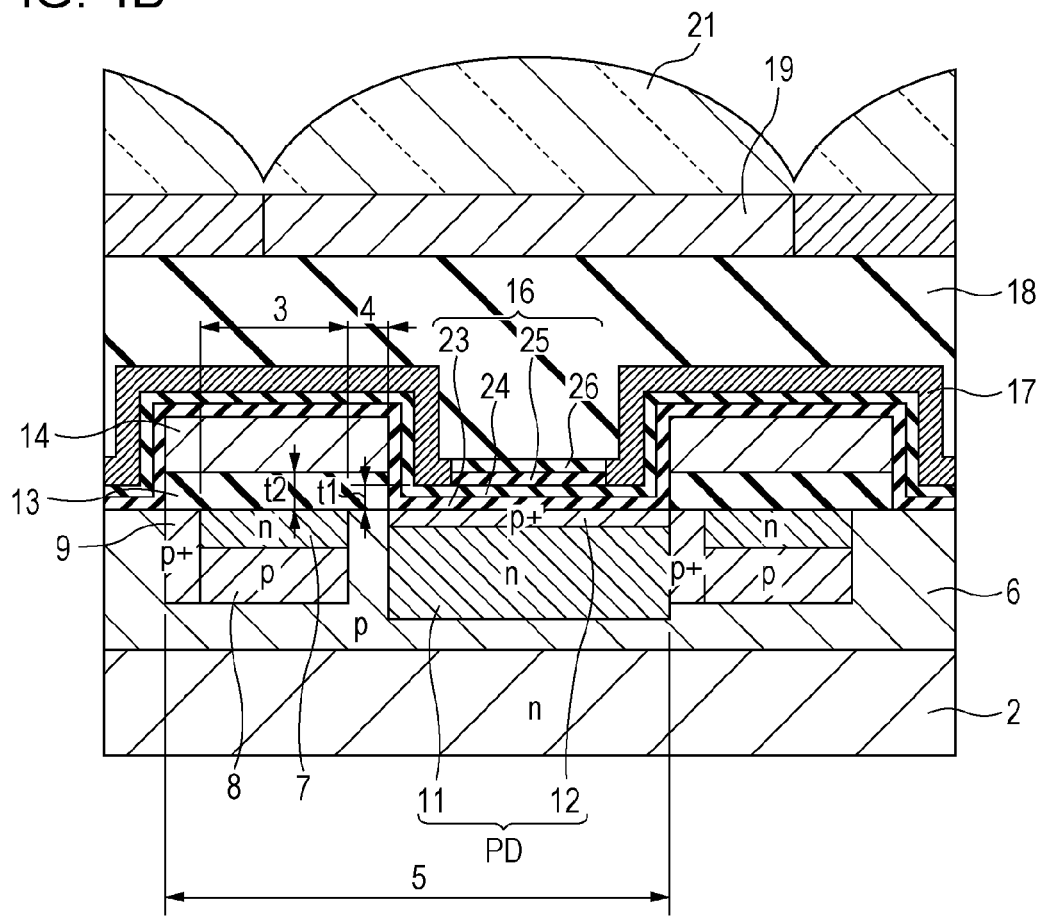

Next, as illustrated in FIG. 4B, the planarized film 18 is formed by an insulating film, the color filter 19 and the on-chip lens 21 are formed in order on the planarized film 18, and the desired solid-state imaging device 1 is obtained.

According to the manufacturing method of the solid-state imaging device 1 according to the present embodiment, after the antireflection film 16 constituted by the films of four layers is formed, in the process of FIG. 3C, the second silicon oxide film 25 is removed by etching with the first silicon nitride film 24 which is the second layer as the etching stopper film. Thereby, the total film thickness t1 is smaller than the thickness t2 of the gate insulating film 13, the films of two layers of the first silicon oxide film 23 and the first silicon nitride film 24 remain, and the gap between the end of the light shielding film and the semiconductor substrate can be stably defined with high accuracy by the films of two layers. The antireflection film constituted by the films of four layers is formed on the main region of the photodiode PD with high accuracy.

Accordingly, even though the region to be light-shielded is miniaturized, the desired solid-state imaging device 1 can be stably manufactured with high accuracy through a simple and easy process. That is, even though the unit pixel size is miniaturized, variations of characteristic values such as smears or white spots or the defect ratio are suppressed, and the solid-state imaging device can be manufactured with a stable yield.

Figure 7:
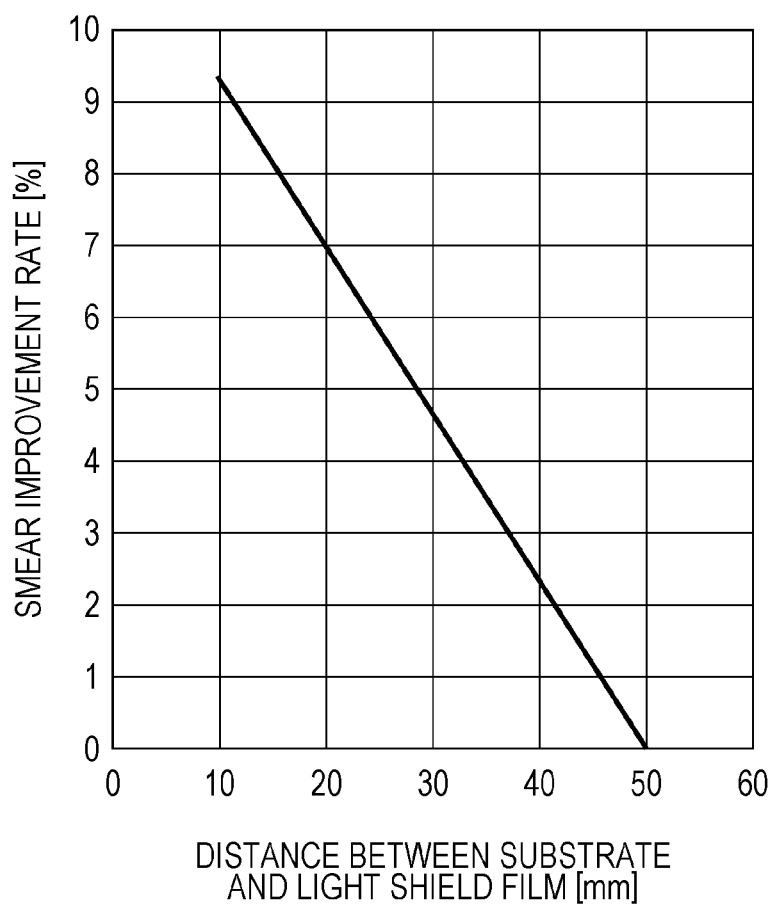
FIG. 7 is a graph illustrating a relationship of a distance (a gap) between an end of a light shielding film and a semiconductor substrate and a smear improvement rate for describing the present disclosure.

FIG. 7 illustrates a relationship of the gap (distance) t1 (nm) between the end of the light shielding film and the semiconductor substrate and a smear improvement rate (%). The smear improvement rate improves as the gap t1 decreases.

As one specific example, Table illustrates the antireflection effect of the antireflection film constituted by the thin films of two layers (Comparative Example) and the antireflection effect of the antireflection film constituted by the thin films of four layers (Example) at a light wavelength of 550 nm. Comparative Example is the antireflection film in which the first silicon oxide film of 5 nm in thickness and the first nitride film of 10 nm in thickness are laminated on the silicon substrate. Example is the antireflection film in which the first silicon oxide film of 5 nm in thickness, the first silicon nitride film of 10 nm in thickness, the second silicon oxide film of 20 nm in thickness, and the second silicon nitride film of 30 nm in thickness are laminated on the silicon substrate.

TABLE

| | Antireflection Film | | | | Wavelength 550 nm | |
|---|---|---|---|---|---|---|
| | First Silicon Oxide Film | First Silicon Nitride Film | Second Silicon Oxide Film | Second Silicon Nitride Film | Trans-parency | Reflect-ance |
| Comparative Example | 5 nm | 10 nm | 0 nm | 0 nm | About 80% | About 20% |
| Example | 5 nm | 10 nm | 20 nm | 30 nm | About 93.3% | About 6.7% |

As illustrated in Table, the antireflection effect of the antireflection film having the structure of the films of four layers is more improved than that of the antireflection film having the structure of the films of two layers.

2. Second Embodiment

Configuration Example of Solid-State Imaging Device

Figure 5:
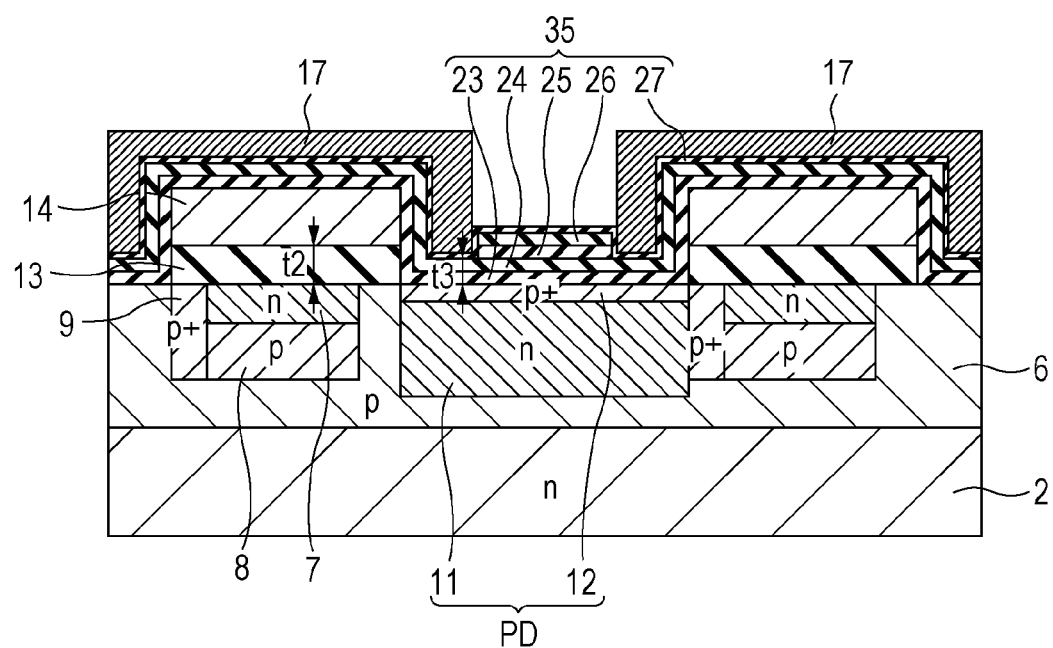
FIG. 5 is a schematic configuration diagram of a main portion illustrating a second embodiment of a solid-state imaging device according to the present disclosure.

FIG. 5 illustrates a second embodiment of a solid-state imaging device according to the present disclosure. The present embodiment is a case which is applied to a CCD solid-state imaging device. FIG. 5 illustrates a cross-sectional configuration of the portion including the photoelectric conversion unit (photodiode) constituting the light sensing portion and the vertical transfer register. In the solid-state imaging device 33 of the second embodiment, similarly to the first embodiment described above, the films of two layers of the first silicon oxide film 23 and the first silicon nitride film 24 are formed on the entire surface including the photodiode PD and the transfer electrode 14. In addition, the second silicon oxide film 25 and the second silicon nitride film 26 are formed on the first silicon nitride film 24 of the main region of the photodiode PD.

Moreover, in the present embodiment, the thinner third silicon oxide film 27 is formed on the entire surface, and an antireflection film 35 constituted by films of five layers is formed on the main region of the photodiode PD. Further, in the above state, the light shielding film 17 covering the transfer electrode 14 is formed. The films of three layers constituted by the first silicon oxide film 23, the first silicon nitride film 24, and the third silicon oxide film 27 are formed between the end of the light shielding film 17 and the semiconductor substrate 2. Accordingly, the gap (distance) between the end of the light shielding film 17 and the semiconductor substrate 2 is defined as the thickness t3 of the films of three layers. The film thickness t3 is set to be smaller than the thickness t2 of the gate insulating film 13.

The other configurations are the same as those of the first embodiment, and the description and the illustration thereof are omitted. In FIG. 5, the same reference numbers are denoted with respect to portions corresponding to those of FIG. 1.

Example of Manufacturing Method of Solid-State Imaging Device

The manufacturing method of the solid-state imaging device 33 of the second embodiment includes the processes of FIGS. 2A to 3C of the first embodiment and a process which forms the third silicon oxide film 27 on the entire surface after the process of FIG. 3C. Thereafter, as illustrated in FIGS. 4A and 4B, the light shielding film 17, the planarized film 18, the color filter 19, and the on-chip lens 21 are formed, and the solid-state imaging device 33 is obtained.

According to the solid-state imaging device 33 of the second embodiment and the manufacturing method thereof, since the film configuration is thin even though the antireflection film 35 is constituted by the films of five layers, similarly to the first embodiment, both the antireflection effect and the light transparency can be improved. In addition, the gap (distance) between the end of the light shielding film 17 and the semiconductor substrate 2 is defined as the insulating film of three layers 23, 24, and 27 having smaller film thickness t3 than the thickness t2 of the gate insulating film 13. Accordingly, even though the unit pixel size is miniaturized, variations of characteristic values such as smears or white spots, or the defect ratio are suppressed, and the solid-state imaging device can be manufactured with a stable yield.

3. Third Embodiment

Configuration Example of Solid-State Imaging Device

Figure 6:
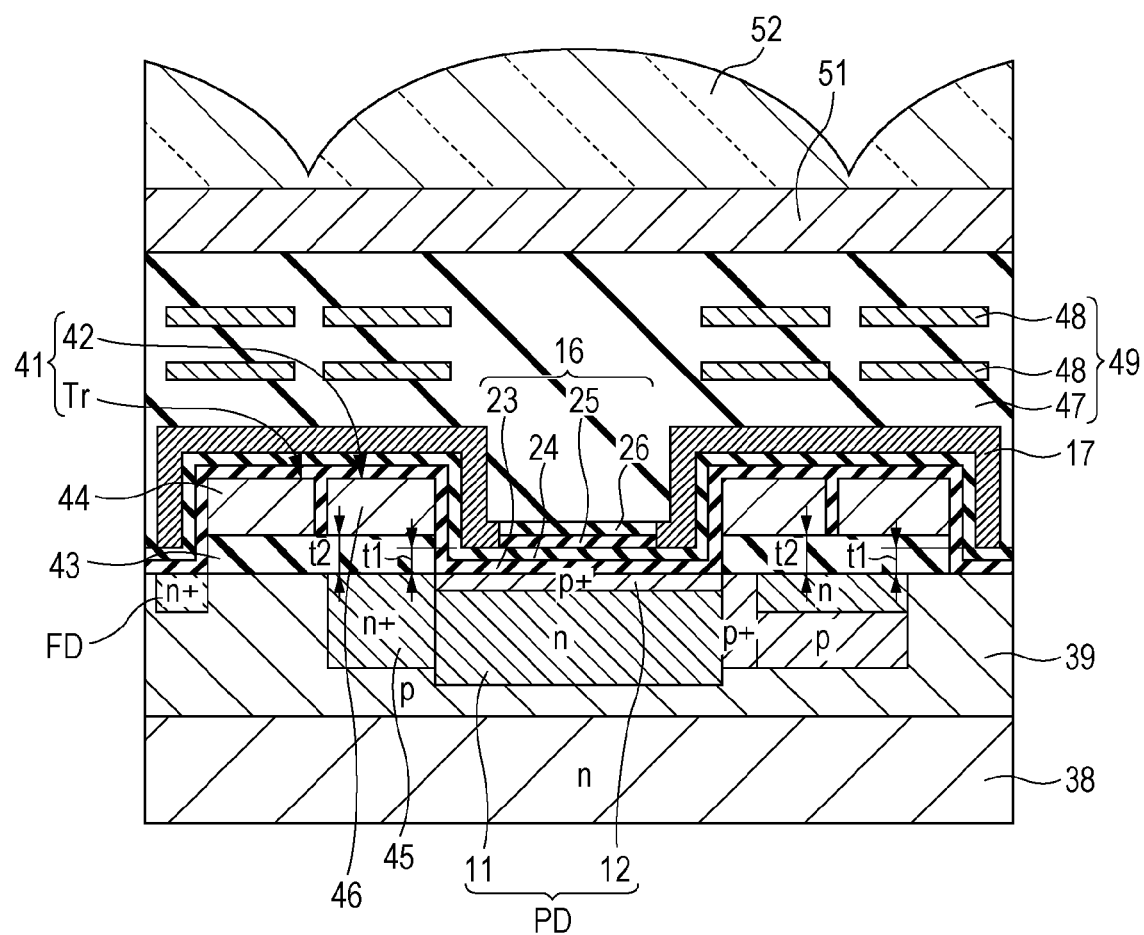
FIG. 6 is a schematic configuration diagram illustrating a third embodiment of a solid-state imaging device according to the present disclosure.

FIG. 6 illustrates a third embodiment of a solid-state imaging device according to the present disclosure. The present embodiment is a case which is applied to a CMOS solid-state imaging device having global shutter function. FIG. 6 illustrates a cross-sectional structure of a portion including the photoelectric conversion unit (photodiode), the transfer transistor, and a charge holding portion.

Although the detailed description of the CMOS solid-state imaging device 37 of the third embodiment is omitted, similarly to the general case, the solid-state imaging device 37 of the third embodiment includes the imaging region in which photodiodes constituting the photoelectric conversion unit and a plurality of pixels constituted by a plurality of pixel transistor are arranged, and the peripheral circuit portion. As the pixel, a unit pixel constituted by single photoelectric conversion unit and a plurality of pixel transistors (MOS transistors) may be applied. In addition, as the pixel, a so-called pixel shared structure in which a plurality of photoelectric conversion units shares other pixel transistors excluding the transfer transistor and a floating diffusion portion can be applied. A plurality of pixel transistors can be constituted by four transistors of a transfer transistor, a reset transistor, an amplification transistor, and a selection transistor, or three transistors in which the selection transistor is omitted, and the like.

As illustrated in FIG. 6, for example, the present embodiment includes the photodiode PD constituting the light sensing portion and the reading unit 41 for reading the signal charges of the photodiode PD on the silicon semiconductor substrate 38. The reading unit 41 is constituted by a charge holding portion (so called memory portion) 42 which is adjacent to the photodiode PD and the transfer transistor Tr1 constituting the pixel. These photodiode PD and reading unit 41 are formed on the first conductivity-type, for example, p-type semiconductor well region 39 which is formed on the second conductivity-type, for example, the n-type semiconductor substrate 38.

The transfer transistor Tr1 includes a transfer gate electrode 44 which is formed via an n-type floating diffusion portion FD and the gate insulating film 43. The charge holding portion 42 is formed between the photodiode PD and the transfer transistor Tr1, and includes a gate electrode 46 which is formed via the n-type semiconductor region 45 and the gate insulating film 43 formed thereon. The charge holding portion 42 is a region which temporarily holds the signal charges from the photodiode PD. After the signal charges turn on the gate electrode of the charge holding portion 42 and are held on the n-type semiconductor region 45, the signal charges are read to the floating diffusion portion FD of the transfer transistor Tr1.

A multilayer wiring layer 49, in which wirings 48 having a plurality of layers are arranged, is formed on the pixel region via an interlayer insulating film 47, and the color filter 51 and the on-chip lens 52 are formed thereon.

In addition, in the present embodiment, the first silicon oxide film 23 and the first silicon nitride film 24 which are the configuration film of the antireflection film are formed on the entire surface on the photodiode PD, the gate electrode 46 of the charge holding portion 42, and the transfer gate electrode 44 of the transfer transistor Tr1. In addition, the second silicon oxide film 25 and the second silicon nitride film 26 are formed on the first silicon nitride film 24 above the main region of the photodiode PD. Accordingly, the antireflection film 16 constituted by the films of four layers of the first silicon oxide film 23, the first silicon nitride film 24, the second silicon oxide film 25, and the second silicon nitride film 26 is formed on the main region of the photodiode PD. In order to cover the transfer gate electrode 44 and the gate electrode 46, the light shielding film 17 of metal, for example, tungsten (W) is formed on the films of two layers of the first silicon oxide film 23 and the first silicon nitride film 24.

When other pixel transistors constituting the pixel also include the reading units which read the signal charges, the light shielding film covering the gate electrode of the other pixel transistors is also formed on the films of two layers of the first silicon oxide film 23 and the first silicon nitride film 24.

Example of Manufacturing Method of Solid-State Imaging Device

In the manufacturing method of the solid-state imaging device 37 of the present embodiment, particularly, the antireflection film 16 constituted by films of four layers on the photodiode PD and the films of two layers of the first silicon oxide film 23 and the first silicon nitride film 24 under the light shielding film 17 can be formed by using the processes of FIGS. 2C to 4A described above.

According to the solid-state imaging device 37 of the third embodiment and the manufacturing method thereof, similarly to the above-described those, since the antireflection film 35 constituted by the films of four layers is formed on the main region of the photodiode PD, both the antireflection effect and the light transparency can be improved. In addition, the gap (distance) between the end of the light shielding film 17 and the semiconductor substrate 38 is defined as the insulating film of two layers 23 and 24 having smaller film thickness t1 than the thickness t2 of the gate insulating film 43. Accordingly, even though the unit pixel size is miniaturized, variations of characteristic values such as smears or white spots, or the defect ratio can be suppressed, and the solid-state imaging device can be manufactured with a stable yield.

Even regarding the CMOS solid-state imaging device in which the transfer transistor Tr1 is arranged so as to be adjacent to the photodiode PD without the charge holding portion 42, the films of four layers constituting the antireflection film can be applied.

As described above, the antireflection film constituted by films of five layers of FIG. 5 can be applied even to the CMOS solid-state imaging device.

In the above examples, the antireflection film constituted by the films of four layers or the films of five layers is described. However, the antireflection film constituted by six or more layers may be used. In this case, the thickness of the antireflection film is the total film thickness capable of improving both the antireflection effect and the light transmittance, and the film thickness between the end of the light shielding film and the semiconductor substrate is also less than the thickness t2 of the gate insulating film 13.

In the solid-state imaging devices according to the above-described embodiments, each solid-state imaging device is constituted so that the signal charges are electrons, the first conductivity-type is the n-type, and the second conductivity-type is p-type. However, the embodiments can be applied to a solid-state imaging device in which the signal charges are positive holes. In this case, the n-type is the second conductivity-type, and the p-type is the first conductivity-type.

4. Fourth Embodiment

Configuration Example of Electronic Apparatus

For example, the solid-state imaging device according to the embodiments of the above-described present disclosure can be applied to electronic apparatuses of a camera system such as a digital camera or a video camera, a mobile phone having an imaging function, other apparatuses having an imaging function, or the like.

Figure 8:
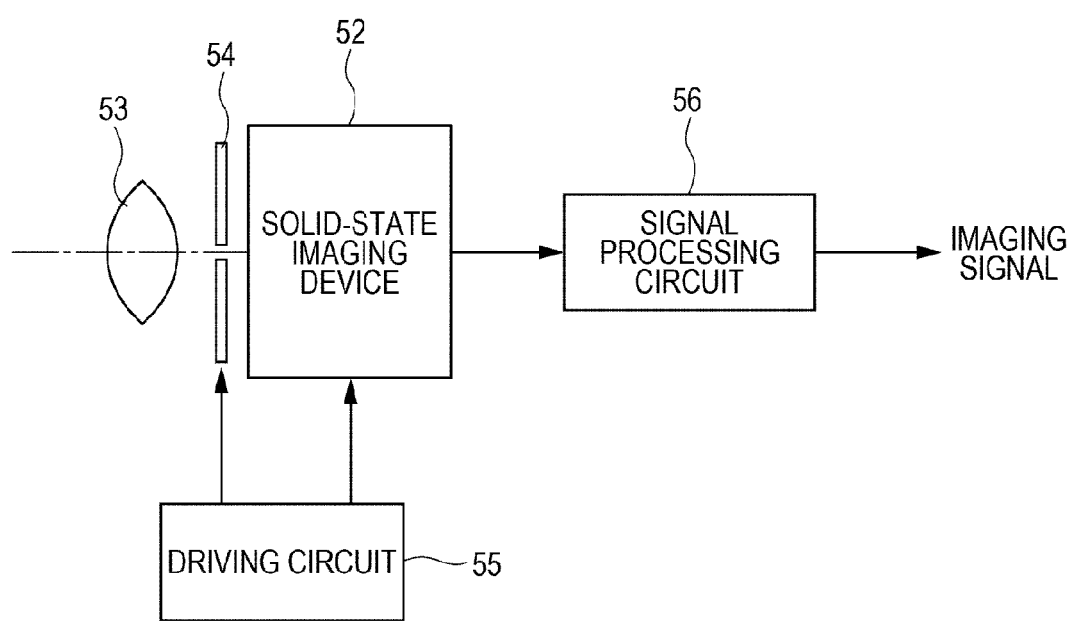
FIG. 8 is a schematic configuration diagram illustrating an electronic apparatus according to a fourth embodiment of the present disclosure.

FIG. 8 illustrates a fourth embodiment which is applied to a camera as an example of an electronic apparatus according to the present disclosure. The camera according to the present embodiment is exemplified by a video camera capable of performing photography of a static image or a moving image. The camera 51 of the present embodiment includes a solid-state imaging device 52, an optical system 53 which introduces incident light into a light sensing portion of the solid-state imaging device 52, a shutter unit 54, a driving circuit 55 which drives the solid-state imaging device 52, and a signal processing circuit 56 which processes an output signal of the solid-state imaging device 52.

Any one of the solid-state imaging devices of the above-described embodiments is applied to the solid-state imaging device 52. The optical system (optical lens) 53 images image light (incident light) from a subject on the imaging surface of the solid-state imaging device 52. Thereby, the signal charges are stored on the solid-state imaging device 52 for a predetermined interval. The optical system 53 may be an optical lens system which is constituted by a plurality of optical lenses. The shutter unit 54 controls the light irradiation interval and the light shield interval into the solid-state imaging device 52. The driving circuit 55 supplies the driving signal which controls the transfer operation of the solid-state imaging device 52 and the shuttering operation of the shutter unit 54. The signal transfer of the solid-state imaging device 52 is performed by the driving signal (timing signal) supplied from the driving circuit 55. The signal processing circuit 56 performs various signal processing. The image signal which is subjected to the signal processing is stored on a storage medium such as memory or output to a monitor.

According to the electronic apparatus of the fourth embodiment, in the solid-state imaging device, both the antireflection effect of the antireflection film and the light transparency can be improved. In addition, even though the unit pixel size is miniaturized, variations of characteristic values such as smears or white spots, or the defect ratio can be suppressed. Accordingly, an electronic apparatus having a high quality image can be provided. For example, a camera or the like having improved image quality can be provided.

The present disclosure contains subject matter related to that disclosed in Japanese Priority Patent Application JP 2010-249477 filed in the Japan Patent Office on Nov. 8, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A solid-state imaging device comprising:
a photoelectric conversion unit that is formed on a semiconductor substrate;
a reading unit that reads signal charges of the photoelectric conversion unit;
a gate insulating film and an electrode disposed thereon that constitute the reading unit;
a light shielding film that covers the electrode; and
an antireflection film that is formed on the photoelectric conversion unit and is constituted by films of four or more layers,
wherein,
a film of a lower layer of the antireflection film is also used as a stopper film during patterning, and
a gap between the end of the light shielding film and the semiconductor substrate which is defined by interposing a plurality of films of the lower layer of the antireflection film is set so as to be smaller than the thickness of the gate insulating film.
2. The solid-state imaging device according to claim 1, wherein:
the antireflection film is constituted by films of four layers, and the gap between the end of the light shielding film and the semiconductor substrate is defined by films of two layers of the lower layer of the antireflection film.

3. The solid-state imaging device according to claim 1, wherein:
the antireflection film is formed by alternatively laminating a silicon oxide film and a silicon nitride film, and
a film of a second layer of the antireflection film is a silicon nitride film which is also used as a stopper film.

4. The solid-state imaging device according to claim 1, wherein:
the reading unit is a vertical transfer register, and
the electrode is a transfer electrode of the vertical transfer register.

5. The solid-state imaging device according to claim 1, wherein:
the reading unit is a transfer transistor and a charge holding portion that constitute a pixel, and
the electrode is a transfer gate electrode of the transfer transistor and a gate electrode of the charge holding portion.

6. A manufacturing method of a solid-state imaging device comprising:
forming a photoelectric conversion unit and a reading unit that reads signal charges of the photoelectric conversion unit on a semiconductor substrate;
forming a gate insulating film and an electrode disposed thereon that selectively constitute the reading unit while excluding the photoelectric conversion unit;
forming films of four or more layers which cover the photoelectric conversion unit and the electrode and constitute an antireflection film;
providing a film of a lower layer of the films of four or more layers as a stopper film, and selectively removing upper films than the stopper film among the films of four or more layers which are disposed on the electrode including the periphery of the photoelectric conversion unit;
thereafter, forming a light shielding film covering the electrode via a plurality of films of the lower layer including the stopper film so that the end of a light shield unit is positioned on the periphery of the photoelectric conversion unit and the gap between the end of the light shielding film and the semiconductor substrate is defined so as to be set smaller than the thickness of the gate insulating film; and
forming the antireflection film constituted by the films of four or more layers on the photoelectric conversion unit.

7. The manufacturing method of a solid-state imaging device according to claim 6, further comprising:
forming the antireflection film by films of four layers; and
defining the gap between the end of the light shielding film and the semiconductor substrate by films of two layers of the lower layer of the antireflection film.

8. The manufacturing method of a solid-state imaging device according to claim 6, further comprising:
forming the antireflection film by alternatively laminating a silicon oxide film and a silicon nitride film; and
forming a film of a second layer of the antireflection film by a silicon nitride film so as to also act as a stopper film.

9. The manufacturing method of a solid-state imaging device according to claim 6, wherein:
the reading unit is a vertical transfer register, and
the electrode is a transfer electrode of the vertical transfer register.

10. The manufacturing method of a solid-state imaging device according to claim 6, wherein:
the reading unit is a transfer transistor and a charge holding portion that constitute a pixel, and
the electrode is a transfer gate electrode of the transfer transistor and a gate electrode of the charge holding portion.

11. An electronic apparatus comprising:
a solid-state imaging device;
an optical system that introduces incident light into a photoelectric conversion unit of the solid-state imaging device; and
a signal processing circuit that processes an output signal of the solid-state imaging device, wherein,
the solid-state imaging device is constituted by the solid-state imaging device according to claim 1.

* * * * *